United States Patent [19]

Bruno et al.

[11] Patent Number: 5,261,014

[45] Date of Patent: Nov. 9, 1993

[54] OPTOELECTRONIC DEVICE WITH INTEGRATED OPTICAL GUIDE AND PHOTO-DETECTOR.

[75] Inventors: Adrien Bruno, Palaiseau; Louis Menigaux, Bures Sur Yvette, both of France

[73] Assignee: France Telecom Etablissement Autonome de Droit Public, Paris, France

[21] Appl. No.: 939,614

[22] Filed: Sep. 2, 1992

[30] Foreign Application Priority Data

Sep. 6, 1991 [FR] France ................. 91 11044

[51] Int. Cl.⁵ .............................. G02B 6/26
[52] U.S. Cl. .................... 385/14; 385/27; 385/29; 385/30; 385/31; 385/39; 385/48; 385/50
[58] Field of Search ............ 385/14, 27, 29, 30, 385/31, 39, 43, 48, 50, 51, 129

[56] References Cited

U.S. PATENT DOCUMENTS

| | | | |
|---|---|---|---|
| 5,138,676 | 8/1992 | Stowe et al. | 385/32 |
| 5,170,448 | 12/1992 | Ackley et al. | 385/31 |

FOREIGN PATENT DOCUMENTS

| | | | |
|---|---|---|---|
| 0278408 | 8/1988 | European Pat. Off. . | |
| 286528 | 10/1988 | European Pat. Off. | 385/14 |
| 0361159 | 4/1990 | European Pat. Off. . | |
| 2655775 | 6/1991 | France . | |
| 3-13906 | 1/1991 | Japan | 385/14 |
| 4-57003 | 2/1992 | Japan | 385/14 |
| 2220083 | 12/1989 | United Kingdom . | |

OTHER PUBLICATIONS

Patent Abstracts of Japan, vol. 8, No. 115(E-247)(1552), May 29, 1984, & JP-59-29472, Feb. 16, 1984, Kiyotaka Wasa, et al., "Substrate For Thin Film Optical Waveguide".

*Primary Examiner*—Frank Gonzalez
*Attorney, Agent, or Firm*—Oblon, Spivak, McClelland, Maier & Neustadt

[57] ABSTRACT

An optoelectronic device having an optical guide and photodetector integrated on a common substrate is provided with a light coupling means for increasing the absorption of light within the photodetector. This means consists of freeing the lower portion of the guide layer—opposite the photodetector—to bring it into contact with air. The use of air has the effect of repelling the light propagating through the guide layer towards the absorbent layer of the photodetector thereby increasing the photodetector efficiency.

4 Claims, 3 Drawing Sheets

OPTOELECTRONIC DEVICE WITH INTEGRATED OPTICAL GUIDE AND PHOTO-DETECTOR.

DESCRIPTION

1. Technical Field

The present invention relates to an optoelectronic device with an integrated optical guide and photodetector and to a process for producing such a device.

It is more particularly used in optoelectronics and in particular optical telecommunications, where the device according to the invention can form the optical receiver of a link (direct detection or heterodyne reception circuit).

The device according to the invention can also be used in optical interconnections between high-speed electronic chips with a high degree of integration (between computers or within computers). Such a device can be used in metrology, e.g. in integrated optical sensors.

2. Prior Art

An optoelectronic device with integrated optical guide and photodetector is shown in FIG. 1. On a semiconductor substrate S, said device successively has a first layer called the lower confinement layer CIC made from a first material having a first index, a second layer called the guide layer CG made from a second material having a second index higher than the first, a third layer called the upper confinement layer CSC made from a third material having a third index lower than the second. These layers are laterally etched to form a guide ribbon or tape RG.

This structure is completed by a photodetector PHD placed above the guide layer. The wave propagated in the guide layer CG reaches the absorbent layer and is absorbed by an evanescent wave mechanism.

An integrated detector-guide device with coupling by evanescent wave is e.g. described in the article by R. J. Deri et al entitled "Integrated Waveguide/Photodiode with Vertical Impedance Matching", published in Proceedings of the 1989 IEDM, Washington D.C., December 1989.

Another known device with an integrated guide and photodetector is shown in FIG. 2. On a substrate S it comprises a n-doped lower confinement layer CIC, an absorbent layer CA, a guide layer CG with a p-diffused part designated D(p), a passivating layer CP and a metal layer M.

Therefore the arrangement is the reverse of that in FIG. 1, in the sense that the absorbent layer CA is positioned below the guide layer CG and not above it. Such a device is described in EP-A-278 408.

Although satisfactory in certain respects, all these devices suffer from disadvantages. In particular, they require a significant photodetector length if it is wished to obtain a total absorption of the optical radiation. However, this is contrary to one of the sought objectives which is to reduce the response time of the device, which would require a reduction of the surface of the detector.

In the article by J. C. Bowers et al entitled "Millimeter-Waveguide-guide Mounted InGaAs Photodetectors", published in Electronics Letters, Jun. 5, 1986, Vol. 22, No. 12, p. 633, it is stated that in order to have a bandwidth at 3 dB higher than 50 GHz, the surface of the diode must be below 200 $\mu m^2$.

The evolution of integrated devices over the last few years has demonstrated the importance attached to the reduction of the surface of the diode by decreasing the absorption length. The table given by M. Erman et al in the article entitled "Optical Circuits and Integrated Detectors", published in IEE Proceedings J, vol. 138, No. 2, April 1991, p. 101 provides information on this. It can be seen that the characteristics of integrated systems tend towards a coupling efficiency close to 100% and an absorption length which is as short as possible.

The structure of FIG. 2 has the particular advantage of being planar because, by reversing the arrangement of the absorbent layer, it avoids the mesa constituted by the photodetector positioned above the guide. However, this variant leads to a very complex production process.

Thus, the absorbent layer CA must be deposited by local repeating of the epitaxy within a portion etched in a n-doped layer (the layer CIC). The guide layer CG is then added by repeat epitaxy. A local diffusion D(p) in the area of the absorbent layer must therefore take place in the guide layer CG by p-doping said portion of the guide. Therefore a detecting diode PIN is obtained, in which I represents an intrinsic zone, i.e. the absorbent layer CA, P represents the diffused zone D(p) and N the n-doped layer CIC below the guide layer CG.

Therefore this process is complex. Moreover, the p-doping induces light energy losses by the charge carriers. Thus, the device suffers from a reduction of the quantum gain.

DESCRIPTION OF THE INVENTION

The present invention aims at obviating these disadvantages. For this purpose it avoids the technical complication of the devices of FIG. 2 and returns to a mesa-type device like that of FIG. 1. However, it improves such devices by having a means able to increase the absorption in the absorbent layer, which makes it possible to reduce the photodetector length.

This means consists of freeing the lower portion of the guide layer CG to bring it into contact with the air. As the index of air is very low compared with that of the materials generally employed for forming the guides, this leads to a significant index mismatching, which has the effect of "repelling" the light towards the absorbent layer and increasing the photodetector efficiency.

The device obtained is very simple to produce, because it only requires a single epitaxy operation. Moreover, the electrical and optical performance characteristics are excellent. There is a maximum quantum gain of 100% and with a 0.65 $\mu m$ thick guide, the photodetector length can be reduced by a factor of 2.

DETAILED DESCRIPTION OF AN EMBODIMENT

Figure 1:
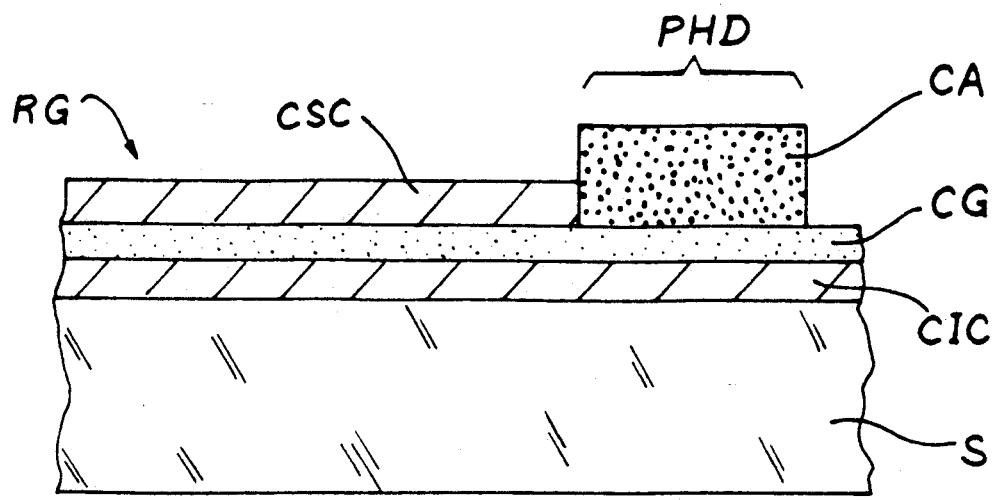
FIG. 1, already described, diagrammatically shows a device having an integrated optical guide and photodetector according to the prior art.
Figure 2:
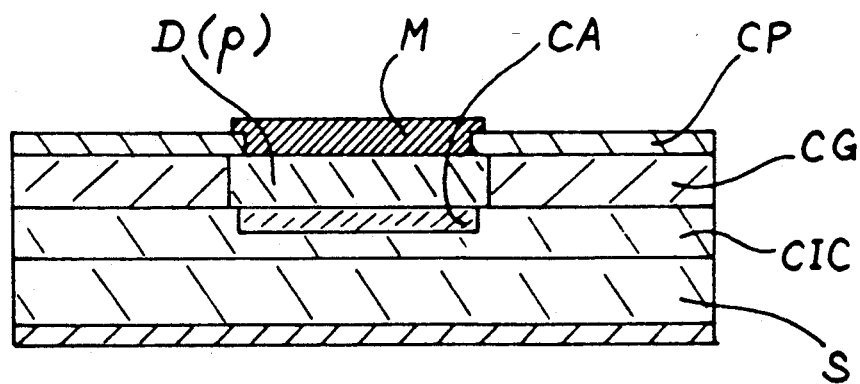
FIG. 2, already described, shows a reverse variant of such a prior art device.
Figure 3:
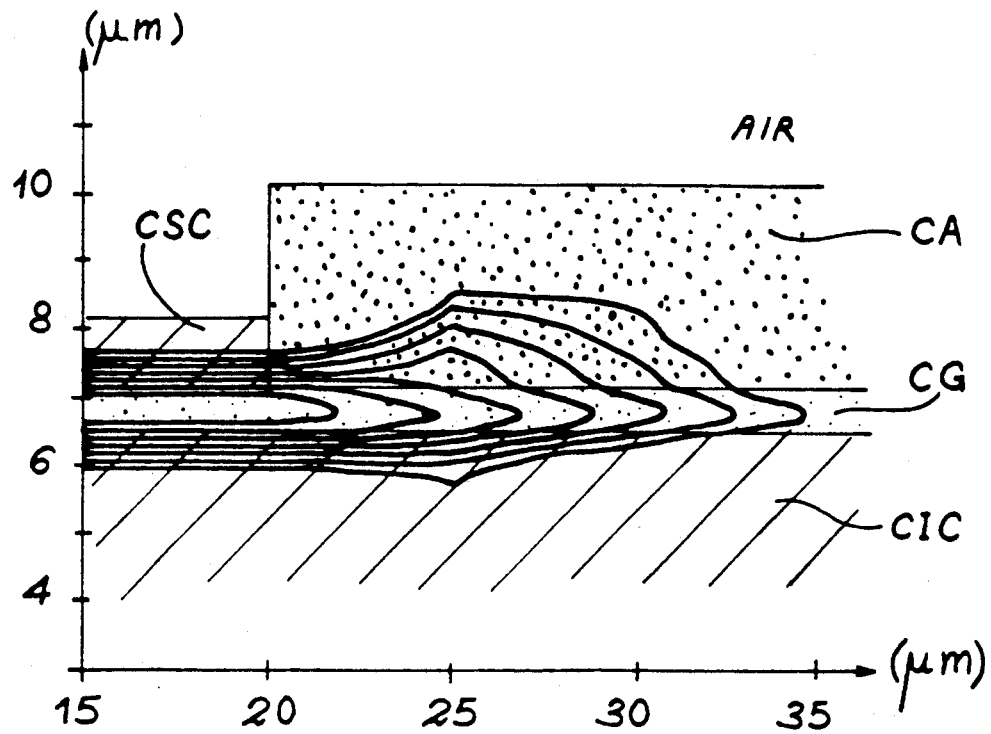
FIG. 3, in section, shows the result of a simulation of the intensity distribution of an optical beam in a device having a known structure.
Figure 4:
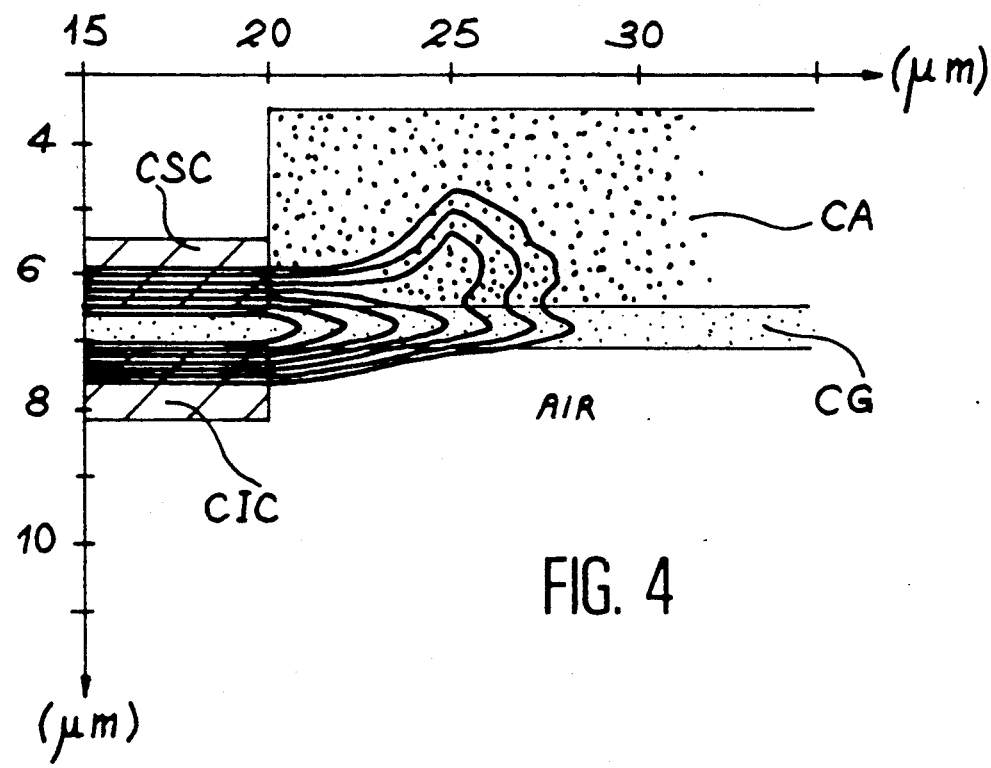
FIG. 4 shows a similar simulation in a device according to the invention.

A theoretical, experimental study enabled the Inventors to demonstrate the effectiveness of an air layer in contact with a guide layer in an integrated device. FIGS. 3 and 4 illustrate the results of this study. They show, in section, the distribution of the intensity of the light beam. It is a question of optical simulations obtained by the Beam Propagation Method or BPM. These simulations make it possible to compare the absorption in a conventional structure (FIG. 3) and in a structure according to the invention (FIG. 4). For the simulation, the Inventors considered a wavelength of 1.52 μm for a beam propagating from left to right. The passage from one curve to the other corresponds to an attenuation of the intensity of the beam by 3 dB (i.e. a factor of 2).

The geometry chosen for the simulation corresponds to a guide structure (left-hand part) with two confinement layers (lower confinement layer CIC and upper confinement layer CSC) made from InP (index 3.17) and a guide layer CG made from GaInAsP (forbidden band at 1.3 μm, index 3.38). The thicknesses of the layers are indicated on the vertical scale in micrometers, i.e. 1 μm for the confinement layers, 0.65 μm for the guide layer CG and 2 μm for the absorbent layer CA.

In the case of FIG. 3, air is not involved in the absorption.

The absorption length is 15 μm for an attenuation of 21 dB (≃99%).

In the case of FIG. 4, the air in contact with the guide layer CG leads to the displacement towards the absorbent layer of the optical mode, which makes it possible to reduce by a factor of 2 the absorption length (8 μm for the same 21 dB attenuation).

FIGS. 5a to 5e illustrate different stages of a production process of a device in accordance with the invention.

Figure 5A:
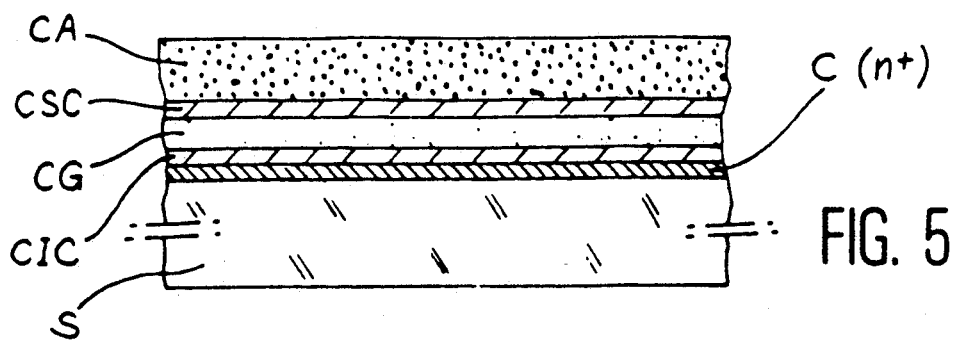
FIGS. 5a, 5b, 5c, 5d and 5e illustrate different stages of the production process according to the invention.
Figure 5B:
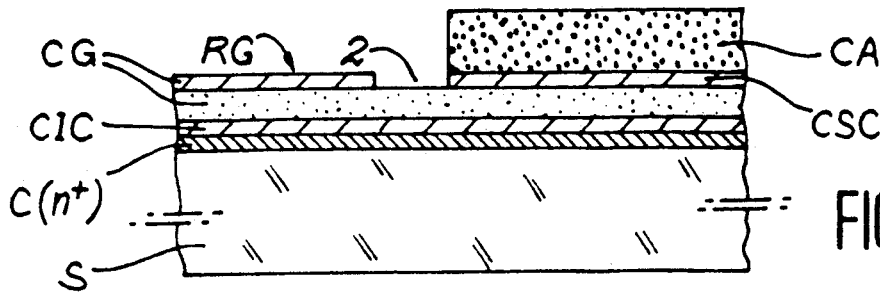
Figure 5C:
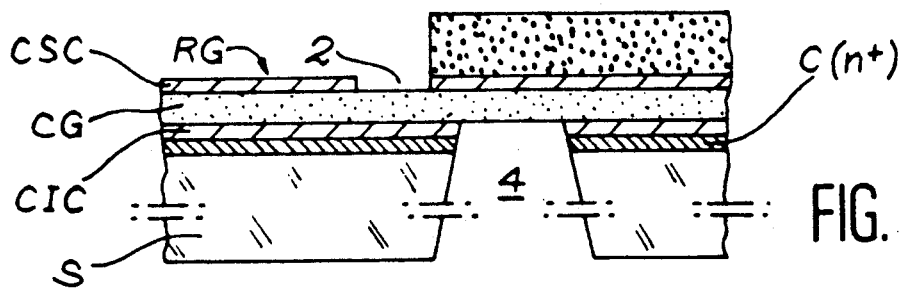
Figure 5D:
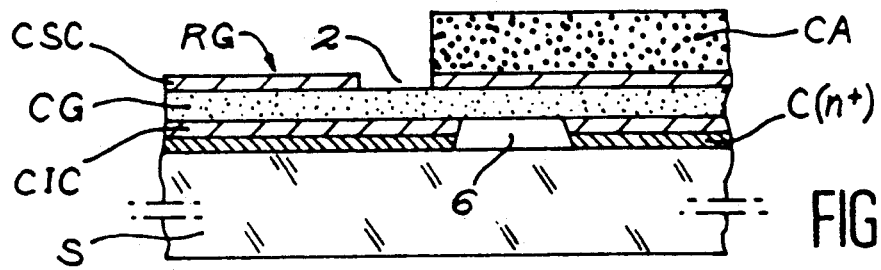
Figure 5E:
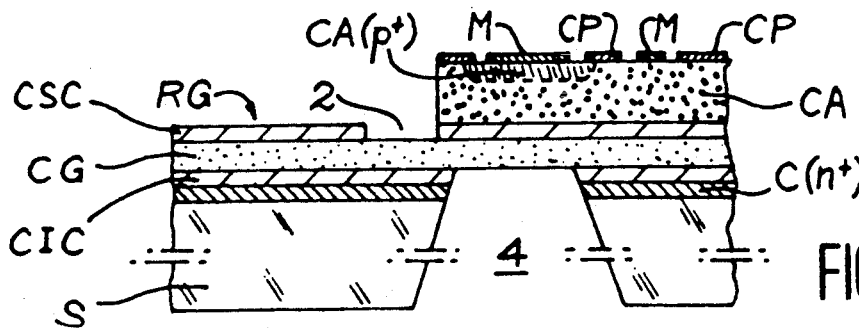

The process diagrammatically comprises four phases:

a) on a substrate S, whose surface is previously n+ doped (layer C(n+)), is deposited by epitaxy a lower confinement layer CIC, a guide layer CG, an upper confinement layer CSC and an absorbent layer CA (FIG. 5a).

b) Lateral etching takes place of the confinement layers and the guide layer in order to form a guide ribbon RG and the absorbent layer CA is etched to give it the shape of a mesa at the end of the guide structure (FIG. 5b). It is also possible to etch the upper confinement layer CSC in front of the mesa over a certain interval 2 of approximately 10 μm. This interval 2 makes it possible to avoid absorption as from entry into the absorbent material, so that the detector is moved away from the edge of the mesa. In this interval 2, the guide layer CG is in contact with air by its upper face, which "repels" the optical wave in depth as a result of the small index of air (compared with the material of the guide, which is generally of GaInAsP). The detector, i.e. the diffusion window, can be removed by approximately 3 μm from the edge of the mesa without any absorption loss on passage into the absorbent zone.

c) Local removal takes place of the lower confinement layer CIC below the mesa in order to bring the lower surface of the guide layer CG into contact with air (FIG. 5c or 5d).

d) On the mesa of the absorbent layer is formed a detector, either of the MSM type, or of the PIN type, or any other known type. It is e.g. possible to form a p+ doped zone (CA(p+)), e.g. using zinc, a contact electrode M, as well as various passivating layers CP (FIG. 5e). The epitaxy stage a) can be carried out by any known procedure, such as metalorganic chemical vapour deposition (MOCVD), molecular beam epitaxy (MBE), etc.

In order to bring the lower surface of the guide layer into contact with the air below the absorbent mesa, two variants are possible:

a hole 4 is formed in the substrate up to the lower confinement layer CIC, followed by selective chemical etching of the said layer CIC without etching the guide layer CG (FIG. 5c).

The substrate is left, but an air pocket 6 is formed (FIG. 5d). For this purpose, etching takes place of the n+ doped layer C(n+) and which is generally of GaInAsP, followed by the etching of the lower confinement layer CIC (generally of InP). It is easier to check etching by subetching for GaInAsP than for InP. Other selective etching methods of this type can be used in particular with the GaAs/GaAlAs system, as described by C. A. Beyler et al in the article entitled "Small Dimension BRAGG Reflection Formed by Air-Isolated GaAs Layers", published in Electronics Letters, Vol. 27, No. 7, p.588, Mar. 28, 1991. The process consists of modifying the crystalline structure by silicon diffusion. Once GaInAsP contraction has taken place, either by the calibration of the lateral etching solution, or by checking during etching using marking patterns, it is possible to pass to the final stage of obtaining the detector.

FIG. 5e shows a finished optoelectronic device, in the variant where the guide layer has been freed by making an opening in the substrate (operation illustrated by the opening 4).

We claim:

1. Optoelectronic device with an integrated optical guide and photodetector comprising, on the same semiconductor substrate (S), an optical guide constituted by a first layer called the lower confinement layer (CIC), a second layer called the guide layer (CG), a third layer called the upper confinement layer (CSC), said layers being laterally etched in order to form a guide ribbon (RG) and a mesa-shaped photodetector (PHD) placed above the upper confinement layer (CSC), said photodetector particularly comprising a fourth layer called the absorbent layer (CA) able to absorb radiation from the guide layer (CG) by evanescence through the upper confinement layer (CSC), said device being characterized in that, in the zone located below the photodetector (PHD), at least the lower confinement layer (CIC) is removed, so that the guide layer (CG) is at least partly in contact with the air below the absorbent layer (CA).

2. Device according to claim 1, characterized in that the substrate (S) is hollowed out below the photodetector (PHD) in order to free the guide layer (CG) below said photodetector (PHD).

3. Device according to claim 1, characterized in that the substrate (S) remains below the photodetector (PHD) and an air pocket (6) is formed below the photodetector (PHD) between the guide layer (CG) and the substrate (S).

4. Device according to any one of the claims 1 to 3, characterized in that the upper confinement layer (CSC) is removed by a certain length (2) in front of the photodetector.

* * * * *